(12) United States Patent
Park et al.

(10) Patent No.: US 11,456,433 B2
(45) Date of Patent: Sep. 27, 2022

(54) LIGHT EMITTING DEVICE HAVING LIGHT-EMITTING LAYER INCLUDING A MANGANESE COMPLEX AND QUANTUM DOTS

(71) Applicant: Samsung Display Co., Ltd., Yongin-si (KR)

(72) Inventors: Kyoungwon Park, Seoul (KR); Minki Nam, Incheon (KR); Hyunmi Doh, Seoul (KR); Sungwoon Kim, Yongin-si (KR); Jae Hong Park, Seoul (KR); Yunku Jung, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/812,123

(22) Filed: Mar. 6, 2020

(65) Prior Publication Data

US 2020/0328367 A1 Oct. 15, 2020

(30) Foreign Application Priority Data

Apr. 12, 2019 (KR) ........................ 10-2019-0043085

(51) Int. Cl.
*H01L 51/50* (2006.01)
*H01L 27/32* (2006.01)
*H01L 51/00* (2006.01)

(52) U.S. Cl.
CPC .......... *H01L 51/502* (2013.01); *H01L 27/322* (2013.01); *H01L 51/0084* (2013.01); *H01L 51/5004* (2013.01); *H01L 51/5056* (2013.01); *H01L 51/5072* (2013.01); *H01L 2251/552* (2013.01)

(58) Field of Classification Search
None
See application file for complete search history.

(56) References Cited

U.S. PATENT DOCUMENTS

| 9,935,269 B2 | 4/2018 | Okubo et al. |
| 2004/0036130 A1* | 2/2004 | Lee ........................ G02B 6/1225 |
| | | 257/409 |
| 2008/0054223 A1 | 3/2008 | Earle et al. |

(Continued)

FOREIGN PATENT DOCUMENTS

| CN | 106188145 A | 12/2016 |
| KR | 10-2018-0059363 A | 6/2018 |
| WO | WO 2014/057968 A1 | 4/2014 |

OTHER PUBLICATIONS

Berezin, Alexey S., et al., "Temperature- and excitation wavelength-dependent emission in a manganese(II) complex," Dalton Transactions, 2018, pp. 1657-1665.

(Continued)

*Primary Examiner* — Erik Kielin
(74) *Attorney, Agent, or Firm* — Lewis Roca Rothgerber Christie LLP

(57) ABSTRACT

A light emitting device may include a first electrode, a second electrode opposite to the first electrode, and an emission layer disposed between the first electrode and the second electrode. The emission layer may include a manganese complex compound and a quantum dot. It is possible to improve life span and light emitting efficiency characteristics of the light emitting device.

19 Claims, 8 Drawing Sheets

(56) References Cited

U.S. PATENT DOCUMENTS

| | | | |
|---|---|---|---|
| 2011/0084250 A1* | 4/2011 | Jang | H05B 33/14 |
| | | | 257/14 |
| 2012/0119239 A1* | 5/2012 | Kim | H01L 27/3293 |
| | | | 257/89 |
| 2013/0063023 A1* | 3/2013 | Pan | C09K 11/06 |
| | | | 313/504 |
| 2018/0148638 A1 | 5/2018 | Ahn et al. | |
| 2019/0144478 A1* | 5/2019 | Chen | C07F 9/54 |
| | | | 257/40 |
| 2021/0167295 A1* | 6/2021 | Stubbs | C09K 11/06 |

OTHER PUBLICATIONS

Chin, Patrick T. K., et al., "Energy transfer in hybrid quantum dot light-emitting diodes," Journal of Applied Physics, vol. 104, 2008, 7 pages.

Xu, Liang-Jin, et al., "Green-Light-Emitting Diodes based on Tetrabromide Manganese(II) Complex through Solution Process," Advanced Materials, 2017, vol. 29, 5 pages.

\* cited by examiner

LIGHT EMITTING DEVICE HAVING LIGHT-EMITTING LAYER INCLUDING A MANGANESE COMPLEX AND QUANTUM DOTS

CROSS-REFERENCE TO RELATED APPLICATION

This application claims priority to and the benefit of Korean Patent Application No. 10-2019-0043085, filed on Apr. 12, 2019, in the Korean Intellectual Property Office, the entire contents of which are hereby incorporated by reference.

BACKGROUND

The present disclosure relate to a light emitting device and a display device including the same, and in particular, to a light emitting device, whose emission layer includes a quantum dot, and a display device including the same.

Various display devices are being developed for use in multimedia devices such as televisions, mobile phones, tablet computers, navigation systems, gaming machines, and/or the like. In a self-luminous display device, a light emitting material containing an organic compound is used to generate light for displaying an image.

In addition, to improve the color reproduction characteristics of the display device, a quantum dot is being developed as a light emitting material of the light emitting device. There is a need in the industry for improved reliability and life span of the light emitting device using the quantum dot.

SUMMARY

One or more aspects of embodiments of the inventive concept are directed toward a light emitting device, which includes an emission layer containing a quantum dot and a host material and has an increased life span and an improved light emitting efficiency.

One or more embodiments of the inventive concept provide a display device including a light emitting device, which contains a quantum dot and a host material, and has good color reproduction characteristics, improved light emitting efficiency, and increased life span.

According to one or more embodiments of the inventive concept, a light emitting device may include a first electrode, a second electrode opposite to the first electrode, and a plurality of functional layers disposed between the first electrode and the second electrode. The functional layers may include an emission layer. The emission layer may include a manganese complex compound and a quantum dot.

In one or more embodiments, the manganese complex compound may be a material represented by the following chemical formula 1:

  Chemical Formula 1

In Chemical Formula 1, X is a univalent or divalent cationic organic compound group, Y is a halogen atom, p is 1 or 2, and q is 4 or 6.

In one or more embodiments, X may be BrMTPP((Bromomethyl)triphenylphosphonium), BrPTPP((3-Bromopropyl)tripheylphosphonium), TPP(tetraphenylphosphonium), TMA(tetraethylammonium), and/or TEA(tetraethylammonium).

In one or more embodiments, the emission layer may include a host and a dopant, the host may include the manganese complex compound, and the dopant may include the quantum dots.

In one or more embodiments, a weight ratio between the manganese complex compound and the quantum dot may range from 1:1 to 1:2.

In one or more embodiments, the emission layer may emit a green light or a red light.

In one or more embodiments, the functional layers may include a hole transport region disposed (positioned) between the first electrode and the emission layer and an electron transport region disposed (positioned) between the emission layer and the second electrode.

In one or more embodiments, the hole transport region may include a plurality of sub-functional layers, and a difference in LUMO energy level between one of the sub-functional layers adjacent to the emission layer and the quantum dot may be greater than or equal to 1.5 eV.

In one or more embodiments, the emission layer may include a plurality of the quantum dots, and the manganese complex compound may fill a space between the plurality of the quantum dots.

According to one or more embodiments of the inventive concept, a display device may include a plurality of light emitting devices. Each of the light emitting devices may include a first electrode, a second electrode opposite to the first electrode, and an emission layer disposed between the first electrode and the second electrode. The emission layer may include a manganese complex compound and a quantum dot.

In one or more embodiments, the manganese complex compound may be a material represented by the following chemical formula 1:

  Chemical Formula 1

In chemical formula 1, X is a univalent or divalent cationic organic compound group, Y is a halogen atom, p is 1 or 2, and q is 4 or 6.

In one or more embodiments, the light emitting devices may include a first light emitting device including a first quantum dot emitting a first color light, a second light emitting device including a second quantum dot emitting a second color light, whose wavelength is longer than that of the first color light, and a third light emitting device including a third quantum dot emitting a third color light, whose wavelength is longer than those of the first color light and the second color light.

In one or more embodiments, the first to third quantum dots may be provided to meet a mean diameter condition given by the following Formula 1:

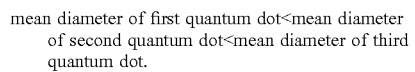  Formula 1

In one or more embodiments, a first emission layer of the first light emitting device, a second emission layer of the second light emitting device, and a third emission layer of the third light emitting device may be provided to meet a thickness condition given by the following Formula 2:

  Formula 2

In Formula 2, T1 is a thickness of the first emission layer, T2 is a thickness of the second emission layer, and T3 is a thickness of the third emission layer.

In one or more embodiments, the display device may further include a light control layer disposed on the light emitting devices.

In one or more embodiments, the light control layer may be a polarization layer.

In one or more embodiments, the light control layer may include a color filter layer. The color filter layer may include a first filter transmitting the first color light, a second filter transmitting the second color light, and a third filter transmitting the third color light.

According to an embodiment of the inventive concept, a display device may include a display panel including a plurality of light emitting devices and a light control layer disposed on the display panel. The light emitting devices may include a first light emitting device including a first emission layer, in which a first quantum dot and a first host are included, a second light emitting device including a second emission layer, in which a second quantum dot and a second host are included, and a third light emitting device including a third emission layer, in which a third quantum dot and a third host are included. At least one of the first to third hosts may be a manganese complex compound represented by the following Chemical Formula 1:

           Chemical Formula 1

In Chemical Formula 1, X is a univalent or divalent cationic organic compound group, Y is a halogen atom, p is 1 or 2, and q is 4 or 6.

In one or more embodiments, X may be BrMTPP((Bromomethyl)triphenylphosphonium), BrPTPP((3-Bromopropyl)tripheylphosphonium), TPP(tetraphenylphosphonium), TMA(tetraethylammonium), and/or TEA(tetraethylammonium).

In one or more embodiments, the first emission layer may emit a blue light, the second emission layer may emit a green light, and the third emission layer may emit a red light.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
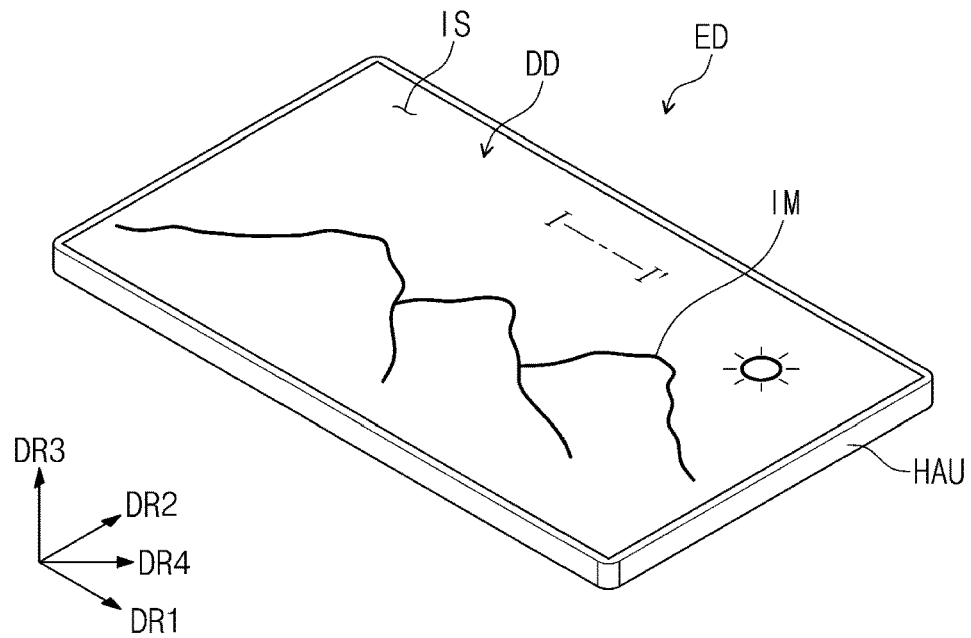
FIG. 1 is a perspective view of an electronic device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their duplicative descriptions will not be provided.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention.

Figure 2:
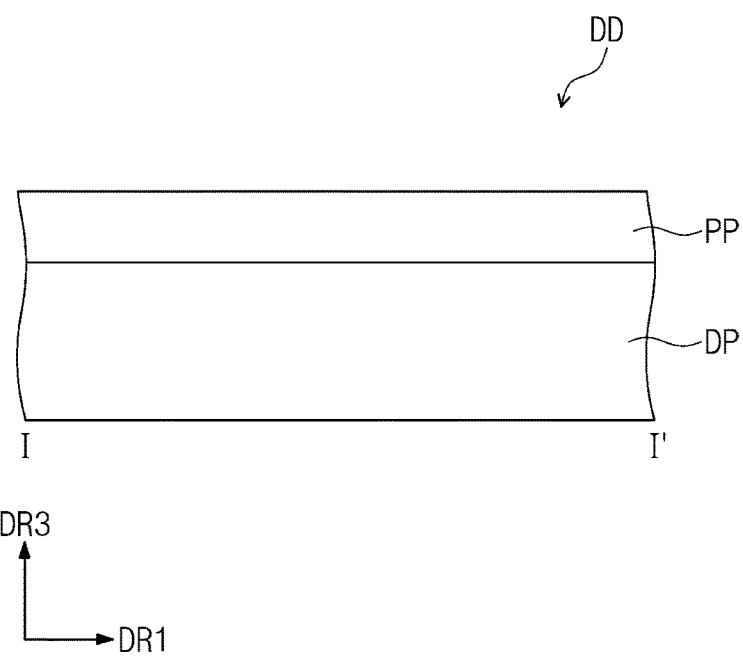
FIG. 2 is a sectional view of a display device, taken along a line I-I' of FIG. 1, according to an embodiment of the inventive concept.
Figure 3:
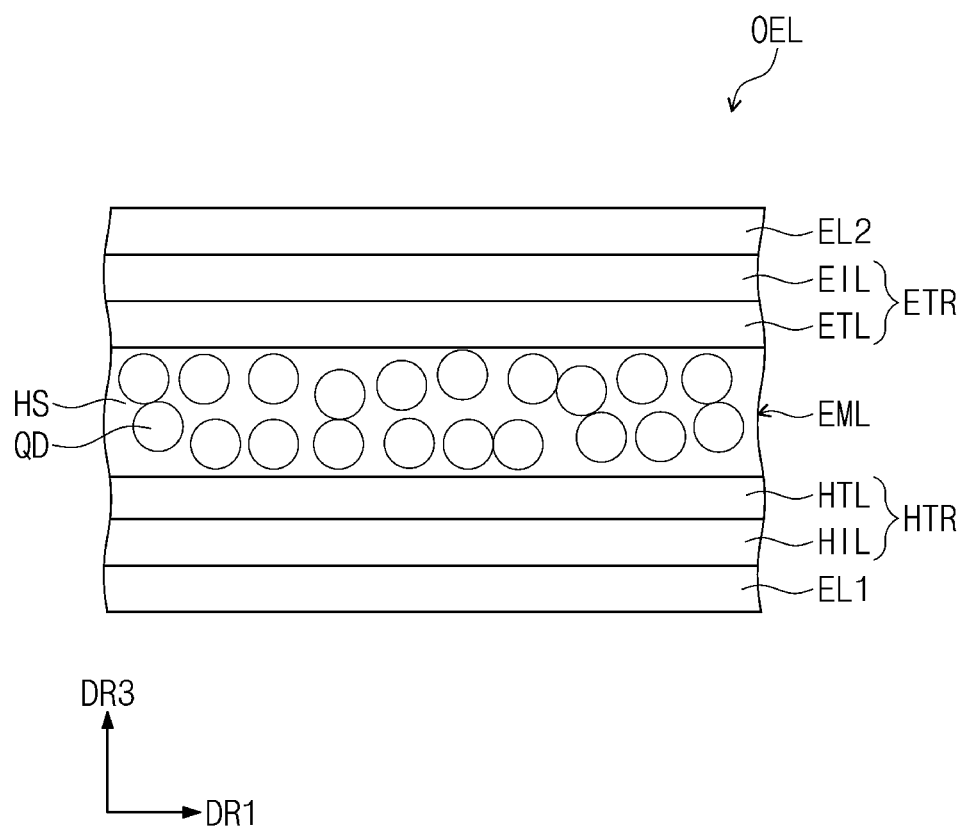
FIG. 3 is a sectional view of a light emitting device according to an embodiment of the inventive concept.

FIG. 1 is a perspective view illustrating an example of an electronic device ED. FIG. 2 is a sectional view illustrating a display device DD according to an embodiment of the inventive concept. FIG. 2 is a sectional view taken along a line I-I' of FIG. 1. FIG. 3 is a sectional view illustrating a light emitting device OEL, according to an embodiment of the inventive concept.

In one or more embodiments, the electronic device ED may be one of large-sized electronic devices (e.g., television sets, monitors, and/or outdoor billboards). In one or more embodiments, the electronic device ED may be one of small- or medium-sized electronic devices (e.g., personal computers, notebook computers, personal digital assistants, car navigation systems, game machines, portable electronic devices, and/or cameras). However, it should be understood that these are some examples of the inventive concept, and that other electronic devices may be used to realize the inventive concept, so long as they do not depart from the inventive concept.

The electronic device ED may include the display device DD and a housing HAU. The display device DD may display an image IM through a display surface IS. In FIG. 1, the display surface IS is illustrated to be parallel to (e.g., to lie in) a plane defined by a first direction axis DR1 and a second direction axis DR2 crossing each other. However, the inventive concept is not limited to this example, and in one or more embodiments, the display surface IS of the display device DD may have a curved shape.

A direction normal to the display surface IS (i.e., a thickness direction of the display device DD or a third direction axis DR3) will be used to indicate a direction, in which the image IM is displayed. A front or top surface and a rear or bottom surface of each member may be distinguished, based on the third direction axis DR3.

A fourth direction axis DR4 may be a direction that is not parallel to both of the first direction axis DR1 and the second direction axis DR2 (e.g., the fourth direction axis DR4 may be a diagonal direction between the first direction axis DR1 and the second direction axis DR2). The fourth direction axis DR4 may be located on or parallel to a plane, which is defined by the first direction axis DR1 and the second direction axis DR2. Directions indicated by the first to fourth direction axes DR1, DR2, DR3, and DR4 are relative, and in certain embodiments, they may be used to indicate other directions.

The housing HAU may be an element containing the display device DD. The housing HAU may be disposed to cover the display device DD while exposing the display surface IS or a top surface of the display device DD. The housing HAU may cover side and bottom surfaces of the display device DD and may expose the entire top surface. However, the inventive concept is not limited to this example, and in one or more embodiments, the housing HAU may cover not only the side and bottom surfaces of the display device DD but also a portion of the top surface.

The display device DD may include a display panel DP and a light control layer PP on the display panel DP. The display panel DP may include the light emitting device OEL. The display device DD may include a plurality of light emitting devices OEL. The light control layer PP may be disposed on the display panel DP to control a reflection light from the display panel DP, which is caused by an external light. The light control layer PP may include, for example, a polarization layer and/or a color filter layer.

FIG. 3 is a diagram illustrating the light emitting device OEL according to an embodiment of the inventive concept, and referring to FIG. 3, the light emitting device OEL may include a first electrode EL1, a second electrode EL2 opposite to the first electrode EL1, and a plurality of functional layers, which are disposed between the first electrode EL1 and the second electrode EL2 and contain an emission layer EML.

The emission layer EML may include a manganese complex compound HS and a quantum dot QD. The emission layer EML may include a plurality of quantum dots QD. The quantum dots QD included in the emission layer EML may be stacked to form a layer. FIG. 3 illustrates an example, in which the quantum dots QD with a circular cross-section are arranged to form two layers, but the inventive concept is not limited to this example. For example, the arrangement of the quantum dots QD may be changed, depending on the thickness of the emission layer EML, the shape of the quantum dot QD included in the emission layer EML, and/or the mean diameter of the quantum dots QD. In one or more embodiments, the quantum dots QD in the emission layer EML may be aligned neighbor (e.g., adjacent) to each other to form a single layer or may be aligned to form a plurality of layers (e.g., two or three layers).

The manganese complex compound HS, along with the quantum dot QD, may be included in the emission layer EML. The manganese complex compound HS may be disposed to fill a space between the quantum dots QD that are adjacent to each other or to enclose the quantum dot QD. That is, in the light emitting device OEL according to one or more embodiments of the inventive concept, the emission layer EML may be filled with or composed of the quantum dot QD and the manganese complex compound HS.

In one or more embodiments, the manganese complex compound HS and the quantum dot QD may be included in the emission layer EML to have a weight ratio of 1:1 to 1:2. In the case where the weight ratio between the manganese complex compound HS and the quantum dot QD ranges from 1:1 to 1:2, a fill factor of a light emitting material in the emission layer EML may be increased, and in this case, it may be possible to reduce loss of electrons or holes and to improve light emitting efficiency and life span characteristics of the light emitting device OEL. For example, if the weight ratio between the manganese complex compound HS and the quantum dot QD is larger than 1:2, the manganese complex compound HS in the emission layer EML may have a relatively low content, and in this case, the fill factor in the emission layer EML may be decreased to cause a reduction in life span of the light emitting device OEL. If the weight ratio between the manganese complex compound HS and the quantum dot QD is less than 1:1, the quantum dot QD in the emission layer EML may have a relatively low content, and in this case, an amount of light emitted from the emission layer EML may be decreased to cause a reduction in optical efficiency of the emission layer EML.

In one or more embodiments, the light emitting device OEL may include a plurality of functional layers, which are disposed between the first electrode EL1 and the second electrode EL2. The functional layers may include a hole transport region HTR, which is disposed between the first electrode EL1 and the emission layer EML, and an electron transport region ETR, which is disposed between the emission layer EML and the second electrode EL2.

Each of the hole transport region HTR and the electron transport region ETR may include a plurality of sub-functional layers. For example, the hole transport region HTR may include a hole injection layer HIL and a hole transport layer HTL as its sub-functional layers, and the electron transport region ETR may include an electron injection layer EIL and an electron transport layer ETL as its sub-functional layers. However, the inventive concept is not limited to this example, and in one or more embodiments, the hole transport region HTR may further include an electron blocking layer and/or the like, as its sub-functional layers, and the electron transport region ETR may further include a hole blocking layer and/or the like, as its sub-functional layers.

In one or more embodiments, the first electrode EU of the light emitting device OEL may be conductive. The first electrode EL1 may be formed of or include at least one of metal alloys or conductive compounds. The first electrode EL1 may be an anode. The first electrode EL1 may be a pixel electrode.

In the light emitting device OEL according to an embodiment of the inventive concept, the first electrode EL1 may be a reflective electrode. However, the inventive concept is not limited to this example. For example, the first electrode EL1 may be a transparent electrode, a transflective electrode, and/or the like. In the case where the first electrode EU is the transflective electrode or the reflective electrode, the first electrode EL1 may be formed of or include at least one of Ag, Mg, Cu, Al, Pt, Pd, Au, Ni, Nd, Ir, Cr, Li, Ca, LiF/Ca, LiF/Al, Mo, Ti, compounds thereof, or mixtures thereof (e.g., a mixture of Ag and Mg). In one or more embodiments, the first electrode EL1 may be a multi-layered structure including a reflective or transflective layer (e.g., of any of the above materials) and a transparent conductive layer (e.g., of indium tin oxide (ITO), indium zinc oxide (IZO), zinc oxide (ZnO), and/or indium tin zinc oxide (ITZO)). For example, the first electrode EL1 may be a multiple metal layer and may have a structure, in which metal layers of ITO/Ag/ITO are stacked.

The hole transport region HTR may be provided on the first electrode EL1. The hole transport region HTR may include the hole injection layer HIL, the hole transport layer HTL, and/or the like. The hole transport region HTR may further include at least one of a hole buffer layer or an electron blocking layer, in addition to the hole injection layer HIL and the hole transport layer HTL. The hole buffer layer may compensate a resonance distance, which depends on the wavelength of light emitted from the emission layer EML, and thus, the hole buffer layer may contribute to increased light emission efficiency. Any suitable material, which may be used as the hole transport region HTR, may be included in the hole buffer layer. The electron blocking layer may prevent or reduce electrons from being injected from the electron transport region ETR into the hole transport region HTR.

The hole transport region HTR may have a single-layered structure, which is formed of a single material or of a plurality of different materials, or a multi-layered structure including a plurality of layers, which are formed of a plurality of different materials. In one or more embodiments, the hole transport region HTR may have a single-layered structure, which is made of a plurality of different materials. In one or more embodiments, the hole transport region HTR may have one of multi-layered structures of the hole injection layer HIL/the hole transport layer HTL, the hole injection layer HIL/the hole transport layer HTL/the hole buffer layer, the hole injection layer HIL/the hole buffer layer, the hole transport layer HTL/the hole buffer layer, or the hole injection layer HIL/the hole transport layer HTL/the electron blocking layer, which are sequentially stacked on the first electrode EL1, but the inventive concept is not limited to these examples.

The hole transport region HTR may be formed by at least one of various suitable methods, such as a vacuum deposition method, a spin coating method, a cast method, a Langmuir-Blodgett (LB) method, an inkjet printing method, a laser printing method, and/or a laser-induced thermal imaging (LITI) method.

The hole injection layer HIL may include phthalocyanine compounds (such as copper phthalocyanine), DNTPD(N,N'-diphenyl-N,N'-bis-[4-(phenyl-m-tolyl-amino)-phenyl]-biphenyl-4,4'-diamine), m-MTDATA(4,4',4"-tris(3-methylphenylphenylamino) triphenylamine), TDATA(4,4'4"-Tris (N,N-diphenylamino)triphenylamine), 2-TNATA(4,4',4"-tris{N,-(2-naphthyl)-N-phenylamino}-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), PANI/PSS((Polyaniline)/Poly(4-styrenesulfonate)), NPB(N,N'-di(naphthalene-1-yl)-N,N'-diphenyl-benzidine), polyether ketone(TPAPEK) containing triphenylamine, 4-Isopropyl-4'-methyldiphenyliodonium Tetrakis(pentafluorophenyl)borate, and/or HAT-CN(dipyrazino[2,3-f: 2',3'-h]quinoxaline-2,3,6,7,10,11-hexacarbonitrile).

The hole transport layer HTL may include, for example, carbazole derivatives (such as N-phenylcarbazole and/or polyvinylcarbazole), fluorine derivatives, triphenylamine derivatives (such as TPD(N,N'-bis(3-methylphenyl)-N,N'-diphenyl-[1,1-biphenyl]-4,4'-diamine) and/or TCTA(4,4',4"-tris(N-carbazolyl)triphenylamine)), NPB(N,N'-di(naphthalene-1-yl)-N,N'-diphenyl-benzidine), TAPC(4,4'-Cyclohexylidene bis[N,N-bis(4-methylphenyl)

benzenamine]), HMTPD(4,4'-Bis[N,N'-(3-tolyl)amino]-3, 3'-dimethylbiphenyl), and/or mCP(1,3-Bis(N-carbazolyl) benzene).

The emission layer EML may be provided on the hole transport region HTR. The emission layer EML may have, for example, a thickness ranging from about 5 nm to about 20 nm or from about 10 nm to about 20 nm. As described above, the emission layer EML may include the manganese complex compound HS and the quantum dot QD.

The manganese complex compound HS may be represented by the following Chemical Formula 1.

Chemical Formula 1

In Chemical Formula 1, X may be a univalent or divalent cationic organic compound group and Y may be a halogen atom. In Chemical Formula 1, p may be 1 or 2, and m may be 4 or 6.

X may be a univalent or divalent cation group and may be, for example, NEDA(N-(1-Naphthyl)ethaneaminium), CETMA(2-(chloroethyl)trimethylammonium), CPTMA((3-carboxypropyl)trimethylammonium), BzTBA(Benzyltribuylammonium), PTEA(phenyltriethylamonium), PPN (Bis(triphenylphosphoranylidene)ammonium, Melam (melamine), TMPhA(Trimethylphenylamonium), BuPyr(1-Butylpyridinium), Piper(piperidinium), DodecA (dodecanaminium), Dipyr([4,4'-dipyridine]-1,1'-diium), PEA(2-Phenylethanaminium), PPA(3-Phenylpropylammonium), Phenan(phenantroline), EBzD(ethylbenzimidate), tOHPyr(2-hydroxypyridinium), TEBzA(Benzyltriethylammonium), MNA(1-methylnicotinamide), DPEDA(N,N'-diphenylethyldiamine), DopA(dopaminium), DAPyr(2,6-diaminopyridinium), DIPA(diisopropylamine), DBA (dibutylamine), tPicol(2-picoline), DMBzA(N,N-dimethyl-1-phenylmethanaminium), VTPP (triphenylvinlphosphonium), BrMTPP((Bromomethyl) triphenylphosphonium), BrPTPP((3-Bromopropyl) tripheylphosphonium), OHETPP((2-Hydroxyethyl) tripheylphosphomum, TPP(tetraphenylphosphonium), MPPP(Methyltriphenylphosphonium), ETPP(Ethyltriphenylphosphonium), BzTPP(benzyltriphenylphosphonium), ATPP(Allyltriphenylphosphonium), PrTPP(Propyltriphenylphosphonium), BuTPP(Butyltriphenylphosphonium), TBP(tetrabutylphosphonium), TPP(tetraphenylphosphonium), TMA(tetraethylammonium), TEA(tetraethylammonium), TPA(tetrapropylammonium), TBA(tetrabutylammonium), BMPIP(Butylmethylpiperidinium), G(guanidinium), Acetam(acetamidinum), and/or TU(thiourea). For example, X may be a cationic form of the aforedescribed compounds and may correspond to a univalent or divalent cation group.

In one or more embodiments, X in the manganese complex compound HS included in the light emitting device OEL may be BrMTPP, BrPTPP, TPP, TMA, and/or TEA.

In Chemical Formula 1, the p may be an integer of 1 or 2. If X is a univalent cation group, the n may be 2, and if X is a divalent cation group, the n may be 1.

$MnY_q$ may be a divalent anion group. In other words, it may be expressed as $MnY_q^{2-}$. Here, the q may be 4 or 6. For example, the $MnY_q^{2-}$ may be $MnY_4^{2-}$ or $MnY_6^{2-}$.

The Y may be a halogen atom and may be Cl, Br, and/or I.

In one or more embodiments, the manganese complex compound HS may be $[Ph_4P]_2MnBr_4$. Here, the $[Ph_4P]$ may correspond to TPP (tetraphenylphosphonium).

In one or more embodiments, the emission layer EML of the light emitting device OEL may include a quantum dot QD. A core of the quantum dot QD may be selected from the group consisting of Groups II-VI compounds, Groups compounds, Groups III-V compounds, Groups IV-VI compounds, Group IV elements, Group IV compounds, and combinations thereof.

The Groups II-VI compounds may be selected from the group consisting of binary compounds (e.g., including CdSe, CdTe, CdS, ZnS, ZnSe, ZnTe, ZnO, HgS, HgSe, HgTe, MgSe, and/or MgS), mixtures of the binary compounds, ternary compounds (e.g., including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and/or HgZnSTe), and mixtures of the quaternary compounds.

The Groups I-III-VI compounds may be selected from the group consisting of ternary compounds (e.g., including $AgInS_2$, $CuInS_2$, $AgGaS_2$, and/or $CuGaS_2$), mixtures of the ternary compounds, quaternary compounds (e.g., including $AgInGaS_2$, $CuInGaS_2$) and mixtures of the quaternary compounds.

The Groups III-V compounds may be selected from the group consisting of binary compounds (e.g., including GaN, GaP, GaAs, GaSb, AlN, AlP, AlAs, AlSb, InN, InP, InAs, and/or InSb), mixtures of the binary compounds, ternary compounds (e.g., including GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and/or GaAlNP), mixtures of the ternary compounds, quaternary compounds (e.g., including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb), and mixtures of the quaternary compounds.

The Groups IV-VI compounds may be selected from the group consisting of binary compounds (e.g., including SnS, SnSe, SnTe, PbS, PbSe, and/or PbTe), mixtures of the binary compounds, ternary compounds (e.g., including SnSeS, SnSeTe, SnSTe, PbSeS, PbSeTe, PbTe, SnPbS, SnPbSe, and/or SnPbTe), mixtures of the ternary compounds, quaternary compounds (e.g., including SnPbSSe, SnPbSeTe, and/or SnPbSTe), and mixtures of the quaternary compounds. The Group IV elements may be selected from the group consisting of Si, Ge, and mixtures thereof. The Group IV compounds may include binary compounds selected from the group consisting of SiC, SiGe, and mixtures thereof.

Here, the binary, ternary, and/or quaternary compound may have a uniform concentration throughout the particle or may have a spatially varying concentration distribution in each particle. In one or more embodiments, each of the quantum dots may have a core/shell structure, in which one quantum dot is enclosed by another quantum dot. At an interface between the core and the shell, an element contained in the shell may have a concentration gradient decreasing in a central direction (e.g., in a direction toward the center of the core).

In some embodiments, the quantum dot QD may have a core-shell structure, which includes a core containing the aforedescribed nanocrystal and a shell surrounding the core. The shell of the quantum dot QD having the core-shell structure may be used as a protection layer, which may prevent or protect chemical characteristics of the core from being changed and may preserve the semiconductor property of the core, and/or may be used as a charging layer, which allows the quantum dot QD to have an electrophoretic property. The shell may be a single layer or a multiple layer.

At an interface between the core and the shell, an element contained in the shell may have a concentration gradient decreasing in a central direction. For example, the shell of the quantum dot QD having the core-shell structure may be formed of or include oxide compounds of metallic and/or nonmetallic elements, semiconductor compounds, or any combination thereof.

The oxide compounds of metallic and/or nonmetallic elements may be, for example, binary compounds (e.g., $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO), and/or ternary compounds (e.g., $MgAl_2O_4$, $CoFe_2O_4$, $NiFe_2O_4$, and/or $CoMn_2O_4$), however, the inventive concept is not limited to these examples.

The semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like, but the inventive concept is not limited to these examples.

Each of the quantum dots QD may have a light-emitting wavelength spectrum whose full width half maximum (FWHM) is less than about 45 nm (for example, less than about 40 nm, or less than about 30 nm), and in this case, it may be possible to improve color purity or color reproduction characteristics. Furthermore, the quantum dots QD may allow light to be emitted radially in all directions, and thus, it may be possible to improve a viewing angle property.

In one or more embodiments, the quantum dot QD may be a spherical, pyramid-shaped, multi-arm, and/or cubic nano particle. In one or more embodiments, the quantum dot QD may be a nano tube, a nano wire, a nano fiber, a nano plate-shaped particle, but the inventive concept is not limited to these examples.

A wavelength or color of light emitted from the quantum dot QD may be determined by a particle size of the quantum dot QD, and by providing quantum dots of various sizes, it may be possible to realize various colors (e.g., blue, red, and/or green). The smaller the particle size of the quantum dot QD, the shorter the wavelength of light emitted from the quantum dot QD. For example, even in the quantum dots QD with the same core, a particle size of a quantum dot emitting a green light may be smaller than a particle size of a quantum dot emitting a red light. In addition, even in the quantum dots QD with the same core, a particle size of a quantum dot emitting a blue light may be smaller than a particle size of a quantum dot emitting a green light. However, the inventive concept is not limited to these examples, and in one or more embodiments, even in the quantum dots QD with the same core, the particle size may be changed depending on the material of the shell, the thickness of the shell, and so forth.

In the case where the quantum dots QD have various light emitting colors, such as blue, red, and/or green, the quantum dots QD with different light emitting colors may be different from each other in their core materials. In the light emitting device OEL according to an embodiment of the inventive concept, the emission layer EML may include a host and a dopant. In one or more embodiments, the emission layer EML may include the manganese complex compound HS and the quantum dot QD, which are used as the host and dopant materials, respectively.

In the light emitting device OEL according to an embodiment of the inventive concept, the emission layer EML may have a fluorescent light emission property. For example, the quantum dot QD may be formed of or include a fluorescent dopant material.

In the light emitting device OEL according to an embodiment of the inventive concept, energy may be transferred from the manganese complex compound HS to the quantum dot QD. For example, the energy may be transferred from the manganese complex compound HS to the quantum dot QD through the Föster Resonance Energy Transfer (FRET) mechanism.

A wavelength of light emitted from the emission layer EML may be changed depending on the kind (or type) of the quantum dot QD. The emission layer EML may include the manganese complex compound HS and the quantum dot QD, and depending on the combination of the manganese complex compound HS and the quantum dot QD, the light emitting device OEL may emit a blue light, a green light, or a red light.

If the manganese complex compound HS is $X_pMnY_4$, the manganese complex compound HS may be used as a host material of the emission layer EML emitting a green light. If the manganese complex compound HS is $X_pMnY_6$, the manganese complex compound HS may be used as a host material of the emission layer EML emitting a red light. For example, in the light emitting device OEL according to an embodiment of the inventive concept, if the manganese complex compound HS is $X_pMnY_4$, the emission layer EML may emit a green light, and if the manganese complex compound HS is $X_pMnY_6$, the emission layer EML may emit a red light.

The emission layer EML may be formed by simultaneously (or concurrently) applying at least one of various suitable methods, such as a vacuum deposition method, a spin coating method, a cast method, a Langmuir-Blodgett (LB) method, an inkjet printing method, a laser printing method, and/or a laser-induced thermal imaging (LITI) method, to the manganese complex compound HS and the quantum dot QD.

In the light emitting device OEL according to an embodiment of the inventive concept, the emission layer EML may further include at least one of suitable anthracene-based light emitting materials.

In one or more embodiments, the emission layer EML may further include at least one of suitable host materials. For example, the emission layer EML may further include $Alq_3$ (tris(8-hydroxyquinolino)aluminum), CBP (4,4'-bis (N-carbazolyl)-1,1'-biphenyl), PVK (poly (n-vinylcabazole), ADN (9,10-di (naphthalene-2-yl)anthracene), TCTA (4,4',4''-Tris (carbazol-9-yl)-triphenylamine), TPBi (1,3,5-tris (N-phenylbenzimidazole-2-yl)benzene), TBADN (3-tert-butyl-9,10-di (naphth-2-yl)anthracene), DSA (distyrylarylene), CDBP (4,4'-bis (9-carbazolyl)-2,2''-dimethylbiphenyl), MADN (2-Methyl-9,10-bis (naphthalen-2-yl)anthracene), DPEPO (bis[2-(diphenylphosphino)phenyl] ether oxide), CP1 (Hexaphenyl cyclotriphosphazene), UGH2 (1,4-Bis (triphenylsilyl)benzene), $DPSiO_3$ (Hexaphenylcyclotrisiloxane), $DPSiO_4$ (Octaphenylcyclotetra siloxane), PPF (2,8-Bis (diphenylphosphoryl)dibenzofuran), mCBP (3,3'-bis (N-carbazolyl)-1,1'-biphenyl), mCP (1,3-Bis (N-carbazolyl)benzene), and/or the like, as its host material. However, the inventive concept is not limited to this example, and in one or more embodiments, besides the host materials enumerated above, at least one of other suitable host materials may be included in the emission layer EML.

In one or more embodiments, the emission layer EML of the light emitting device OEL may further include at least one of suitable dopant materials. For example, the emission layer EML may further include styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino) styryl)naphthalen-2-yl)vinyl)phenyl)-N-phenylbenzenamine (N-BDAVBi), perylene and its derivatives (e.g., 2,5,8,11-Tetra-t-butylperylene (TBP)), pyrene and its derivative (e.g., 1,1-dipyrene, 1,4-dipyrenylbenzene, 1,4-Bis(N,N-Diphenylamino)pyrene, and/or 2,5,8,11-Tetra-t-butylperylene (TBP)), as its dopant material.

In the light emitting device OEL according to one or more embodiments of the inventive concept, the electron transport region ETR may be provided on the emission layer EML. The electron transport region ETR may include at least one of the hole blocking layer, the electron transport layer ETL, and the electron injection layer EIL, but the inventive concept is not limited to this example.

The electron transport region ETR may have a single-layered structure, which is formed of a single material or of a plurality of different materials, or a multi-layered structure including a plurality of layers, which are formed of a plurality of different materials.

For example, the electron transport region ETR may have a single-layered structure of the electron injection layer EIL or the electron transport layer ETL or may have a single-layered structure formed of the electron injection material and the electron transport material. In one or more embodiments, the electron transport region ETR may have a single-layered structure, which is made of a plurality of different materials, or may have a structure of the electron transport layer ETL/the electron injection layer EIL or of the hole blocking layer/the electron transport layer ETL/the electron injection layer EIL, which are sequentially stacked from the emission layer EML, but the inventive concept is not limited to these examples. A thickness of the electron transport region ETR may range, for example, from about 200 Å to about 1500 Å.

The electron transport region ETR may be formed by at least one of various suitable methods, such as a vacuum deposition method, a spin coating method, a cast method, a Langmuir-Blodgett (LB) method, an inkjet printing method, a laser printing method, and/or a laser-induced thermal imaging (LITI) method.

In the case where the electron transport region ETR includes the electron transport layer ETL, the electron transport region ETR may include at least one of anthracene-based compounds. However, the inventive concept is not limited to this example, and in one or more embodiments, the electron transport region ETR may include for example, at least one of $Alq_3$(Tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, TPBi (1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), $Bebq_2$(berylliumbis (benzoquinolin-10-olate), ADN(9,10-di(naphthalene-2-yl)anthracene), or mixtures thereof. A thickness of the electron transport layer ETL may range from about 100 Å to about 1000 Å (in particular, from about 150 Å to about 500 Å). In the case where the thickness of the electron transport layer ETL is within such a range, it may be possible to obtain a satisfactory electron transport property, without a substantial increase in driving voltage.

In the case where the electron transport region ETR includes the electron injection layer EIL, the electron transport region ETR may include halogenated metals, metal lanthanides, and/or co-deposited materials of halogenated metals and metal lanthanides, and/or the like. In one or more embodiments, the halogenated metals may be halogenated alkali metals. For example, the electron transport region ETR may include LiF, Liq (Lithium quinolate), $Li_2O$, BaO, NaCl, CsF, Yb, RbCl, RbI, KI, and/or KI:Yb, but the inventive concept is not limited to these examples. In one or more embodiments, the electron injection layer EIL may be formed of a material, in which an electron transport material and an insulating organo metal salt are mixed. For example, the organo metal salt may include metal acetate, metal benzoate, metal acetoacetate, metal acetylacetonate, and/or metal stearate. A thickness of the electron injection layer EIL may range from about 1 Å to about 100 Å or range from about 3 Å to about 90 Å. In the case where the thickness of the electron injection layer EIL is within such a range, it may be possible to obtain a satisfactory electron injection property, without a substantial increase in driving voltage.

As described above, the electron transport region ETR may include the hole blocking layer. The hole blocking layer may include at least one of, for example, BCP (2,9-dimethyl-4,7-diphenyl-1,10-phenanthroline) or Bphen (4,7-diphenyl-1,10-phenanthroline), but the inventive concept is not limited to these examples.

The second electrode EL2 may be provided on the electron transport region ETR. The second electrode EL2 may be a common electrode or a cathode. The second electrode EL2 may be a transparent electrode, a transflective electrode, or a reflective electrode. If the second electrode EL2 is the transparent electrode, the second electrode EL2 may be formed of a transparent metal oxide (such as indium tin oxide (ITO), indium zinc oxide (IZO), zinc oxide (ZnO), and/or indium tin zinc oxide (ITZO)).

If the second electrode EL2 is the transflective or reflective electrode, the second electrode EL2 may be formed of or include at least one of Ag, Mg, Cu, Al, Pt, Pd, Au, Ni, Nd, Ir, Cr, Li, Ca, LiF/Ca, LiF/Al, Mo, Ti, compounds thereof, or mixtures thereof (e.g., a mixture of Ag and Mg). In one or more embodiments, the second electrode EL2 may be a multi-layered structure including a reflective or transflective layer (e.g., of the above material) and a transparent conductive layer (e.g., of indium tin oxide (ITO), indium zinc oxide (IZO), zinc oxide (ZnO), and/or indium tin zinc oxide (ITZO)).

The second electrode EL2 may be connected to an auxiliary electrode. If the second electrode EL2 is connected to the auxiliary electrode, the resistance of the second electrode EL2 may be decreased.

Figure 4:
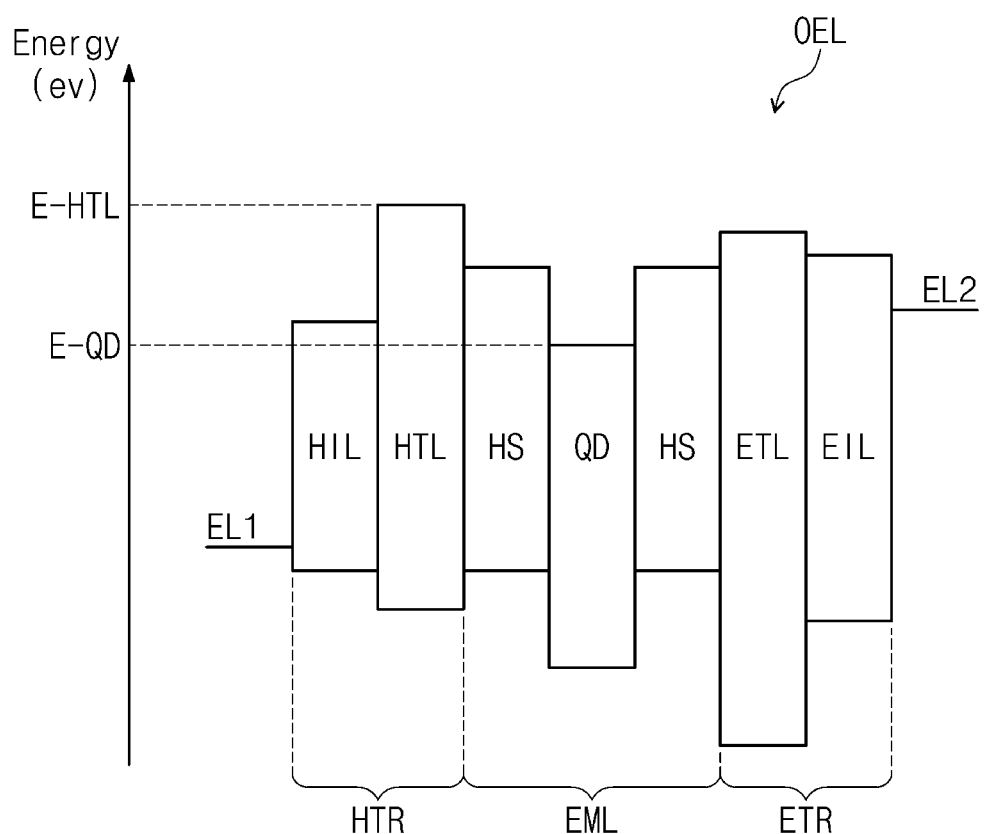
FIG. 4 is an energy band diagram showing a band structure of a light emitting device according to an embodiment of the inventive concept.

FIG. 4 is an energy band diagram showing a band structure of the light emitting device OEL according to an embodiment of the inventive concept. FIG. 4 shows relative energy levels of the electrodes EL1 and EL2 and the functional layers HTR, EML, and ETR, not an absolute value of an energy level. In the energy band diagram, in which the sub-functional layers HIL, HTL, ETL, and EIL, the manganese complex compound HS and the quantum dot QD are depicted by rectangular boxes, the top of the rectangular box represents a lowest unoccupied molecular orbital (LUMO) energy level, and the bottom of the rectangular box represents a highest occupied molecular orbital (HOMO) energy level.

In FIG. 4, a LUMO energy level of the hole transport layer HTL is represented by E-HTL, and a LUMO energy level of the quantum dot QD is represented by E-QD. In one or more embodiments, a difference between the LUMO energy levels E-HTL and E-QD of the hole transport layer HTL and the quantum dot QD may be greater than or equal to 1.5 eV.

Since the difference in LUMO energy level between the hole transport layer HTL and the quantum dot QD is greater than or equal to 1.5 eV, it may be possible to reduce loss of electrons, which are lost from the emission layer EML to the hole transport region HTR. In addition, it may be possible to suppress or prevent the hole transport region HTR from being damaged by movement of electrons. However, the inventive concept is not limited to this example, and in one or more embodiments, the difference in LUMO energy level between the hole transport layer HTL and the quantum dot QD may be less than 1.5 eV, as long as the electron loss from the emission layer EML to the hole transport region HTR can be reduced or minimized.

Since the emission layer EML includes the manganese complex compound HS whose LUMO energy level is higher than that of the quantum dot QD, the manganese complex compound HS may serve as an energy barrier, and thus, it may be possible to reduce an amount of electrons, which are transferred to the hole transport layer HTL and are lost.

In the light emitting device OEL according to an embodiment of the inventive concept, the emission layer EML may include the manganese complex compound HS whose LUMO energy level is higher than that of the quantum dot QD, and the hole transport layer HTL and the quantum dot QD may be provided such that the difference in LUMO energy level therebetween is greater than or equal to 1.5 eV. Thus, it may be possible to reduce an amount of electrons, which are transferred to the hole transport layer HTL, and consequently to improve the light emitting efficiency of the quantum dot QD. As a result, it may be possible to improve the efficiency of the light emitting device OEL.

In FIG. 4, the hole transport layer HTL, which is one of the sub-functional layers of the hole transport region HTR, is illustrated to be a sub-functional layer of the hole transport region HTR most adjacent to the emission layer EML, but the inventive concept is not limited to this example. For example, the hole transport region HTR may further include an electron blocking layer, which is used as a sub-functional layer adjacent to the emission layer EML, and in this case, a difference between a LUMO energy level of the electron blocking layer and the LUMO energy level E-QD of the quantum dot QD may be greater than or equal to 1.5 eV.

That is, in the light emitting device OEL according to one or more embodiments of the inventive concept, a difference between a LUMO energy level of a sub-functional layer, which is one of the plurality of sub-functional layers included in the hole transport region HTR and is most adjacent to the emission layer EML, and the LUMO energy level E-QD of the quantum dot QD may be greater than or equal to 1.5 eV.

Figure 5:
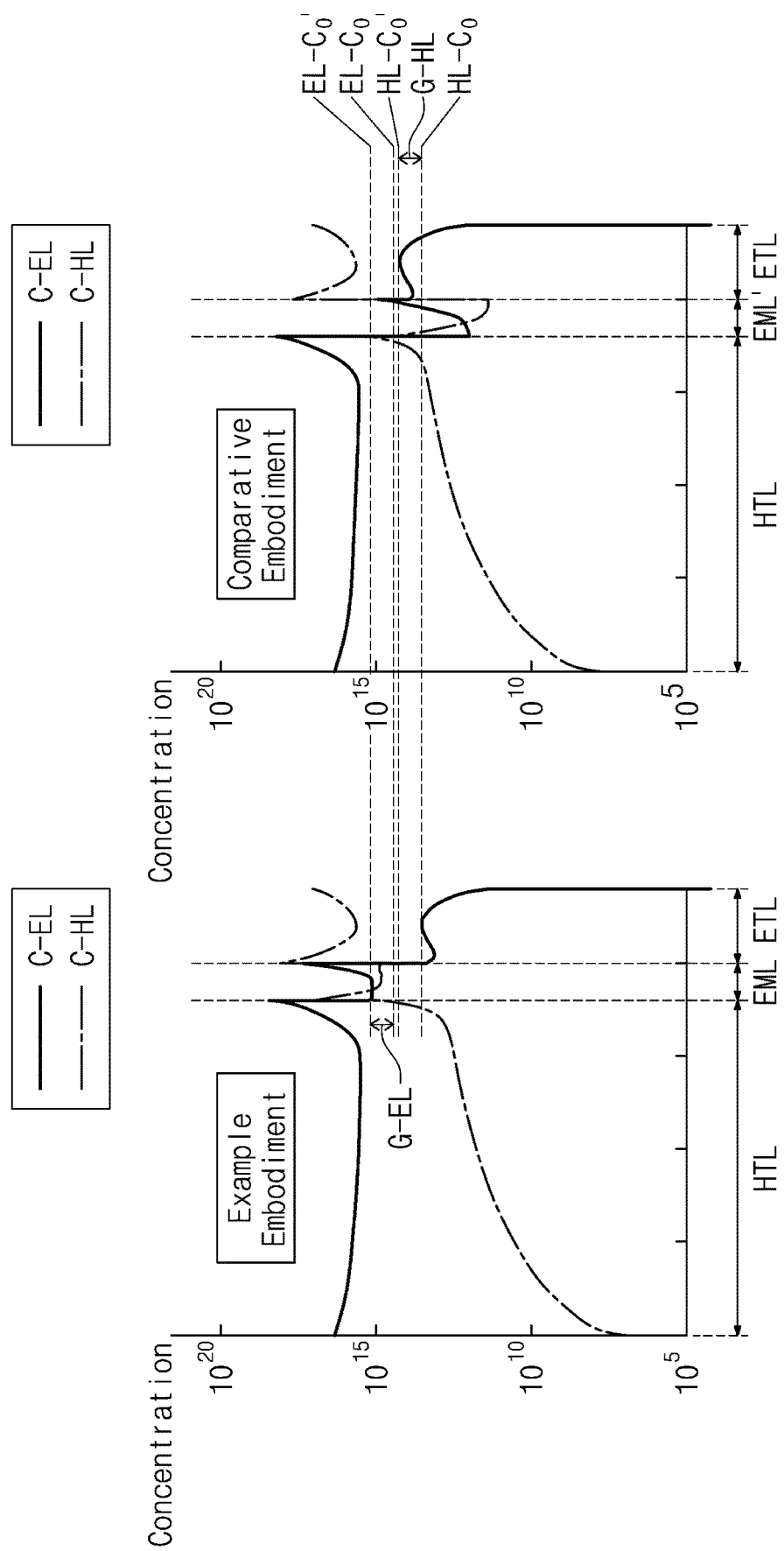
FIG. 5 is a graph showing concentration distributions of holes and electrons, in example and comparative embodiments.

FIG. 5 shows concentration distributions of holes and electrons in example and comparative embodiments of the present disclosure, in a comparative manner. In FIG. 5, a light emitting device according to the example embodiment has the same structure as the light emitting device OEL of FIG. 3, whereas a light emitting device according to the comparative example has a structure, from which the manganese complex compound HS of the emission layer EML is removed, unlike the example embodiment. In the light emitting devices according to the example and comparative examples, the functional layers HTL and ETL may have substantially the same structure, although there is a difference in structure between the emission layers EML and EML'.

FIG. 5 shows a hole concentration C-HL and an electron concentration C-EL in the hole transport layer HTL, the emission layer EML, and the electron transport layer ETL.

In FIG. 5, EL-$C_O$ represents an electron concentration at an interface between the hole transport layer HTL and the emission layer EML in the example embodiment, and EL-$C_{O'}$ represents an electron concentration at an interface between the hole transport layer HTL and the emission layer EML' in the comparative example. G-EL represents a difference between EL-$C_O$ and EL-$C_{O'}$. Referring to FIG. 5, the electron concentration at the interface between the hole transport layer HTL and the emission layer EML was lower in the example embodiment than in the comparative example. Without being bound by any particular theory, it is believed that this may be because, for the example embodiment, due to the presence of the manganese complex compound further provided in the emission layer EML, an amount of electrons transferred from the emission layer EML to the hole transport layer HTL was reduced.

In FIG. 5, HL-Co represents a hole concentration at an interface between the electron transport layer ETL and the emission layer EML in the example embodiment, and HL-$C_{O'}$ represents a hole concentration at an interface between the electron transport layer ETL and the emission layer EML' in the comparative example. G-HL represents a difference between HL-$C_O$ and HL-$C_{O'}$. Referring to FIG. 5, the hole concentration at the interface between the electron transport layer ETL and the emission layer EML was lower in the example embodiment than in the comparative example. Without being bound by any particular theory, it is believed that this may be because, for the example embodiment, due to the manganese complex compound further provided in the emission layer EML, an amount of holes transferred from the emission layer EML to the electron transport layer ETL was reduced.

The light emitting device according to one or more embodiments of the inventive concept may further include the manganese complex compound in the emission layer, in addition to the quantum dot, and the manganese complex compound may enable the light emitting device to have high light emitting efficiency. In the light emitting device according to one or more embodiments of the inventive concept, the manganese complex compound included in the emission layer may keep electric charges (such as holes or electrons, which are provided from the hole or electron transport region adjacent to the emission layer) in the emission layer, and may transfer an energy to the quantum dot to improve efficiency of light generated by the quantum dot. In addition, in the light emitting device according to one or more embodiments of the inventive concept, because the emission layer includes not only the quantum dot but also the manganese complex compound, thus increasing the fill factor of the emission layer, it may be possible to suppress or reduce a resistance increasing issue, which may be caused by movement of electric charges, compared with the case in which the emission layer includes only the quantum dot, and thereby to realize high light emitting efficiency.

Figure 6:
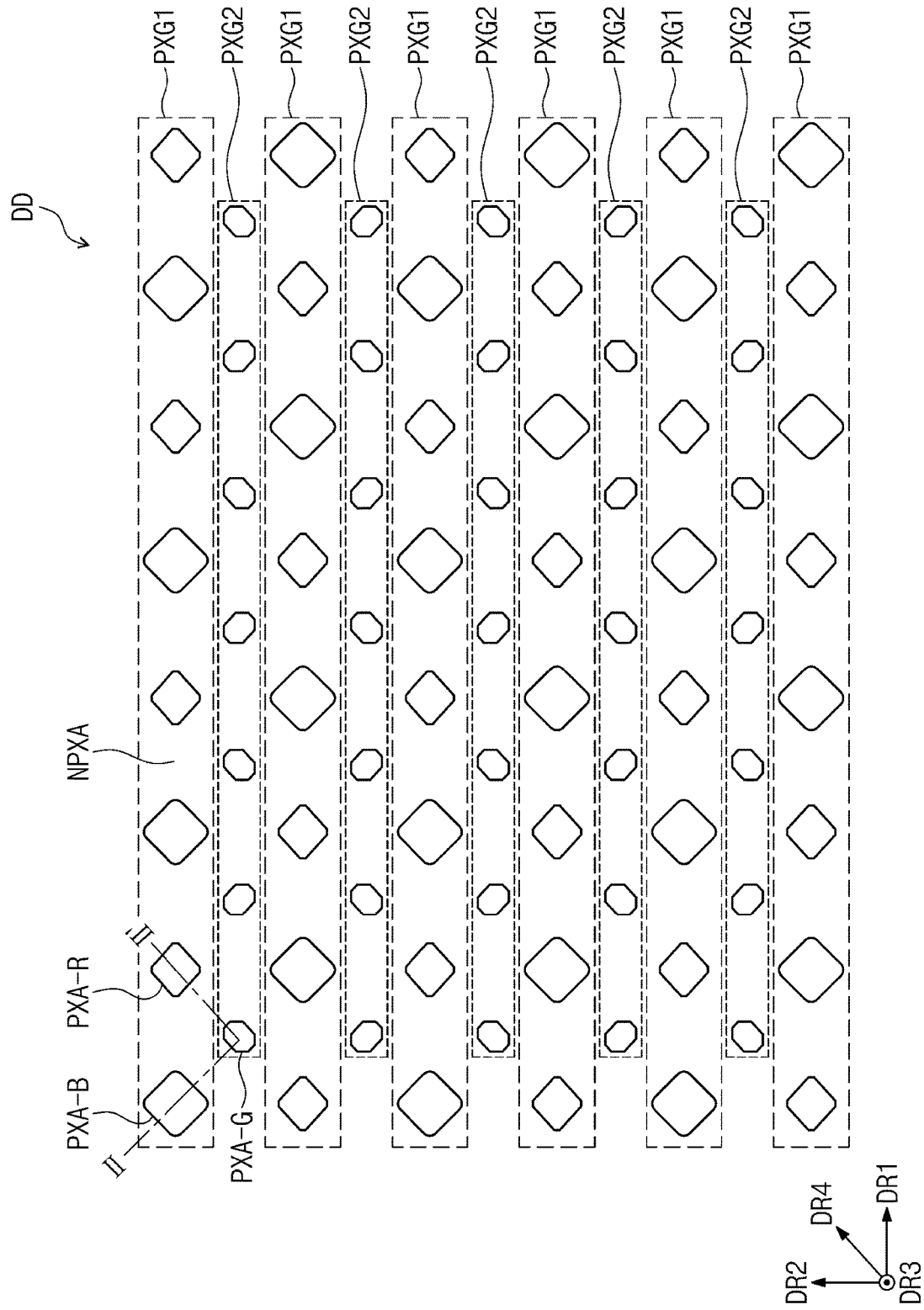
FIG. 6 is a plan view of a display device according to an embodiment of the inventive concept.
Figure 7:
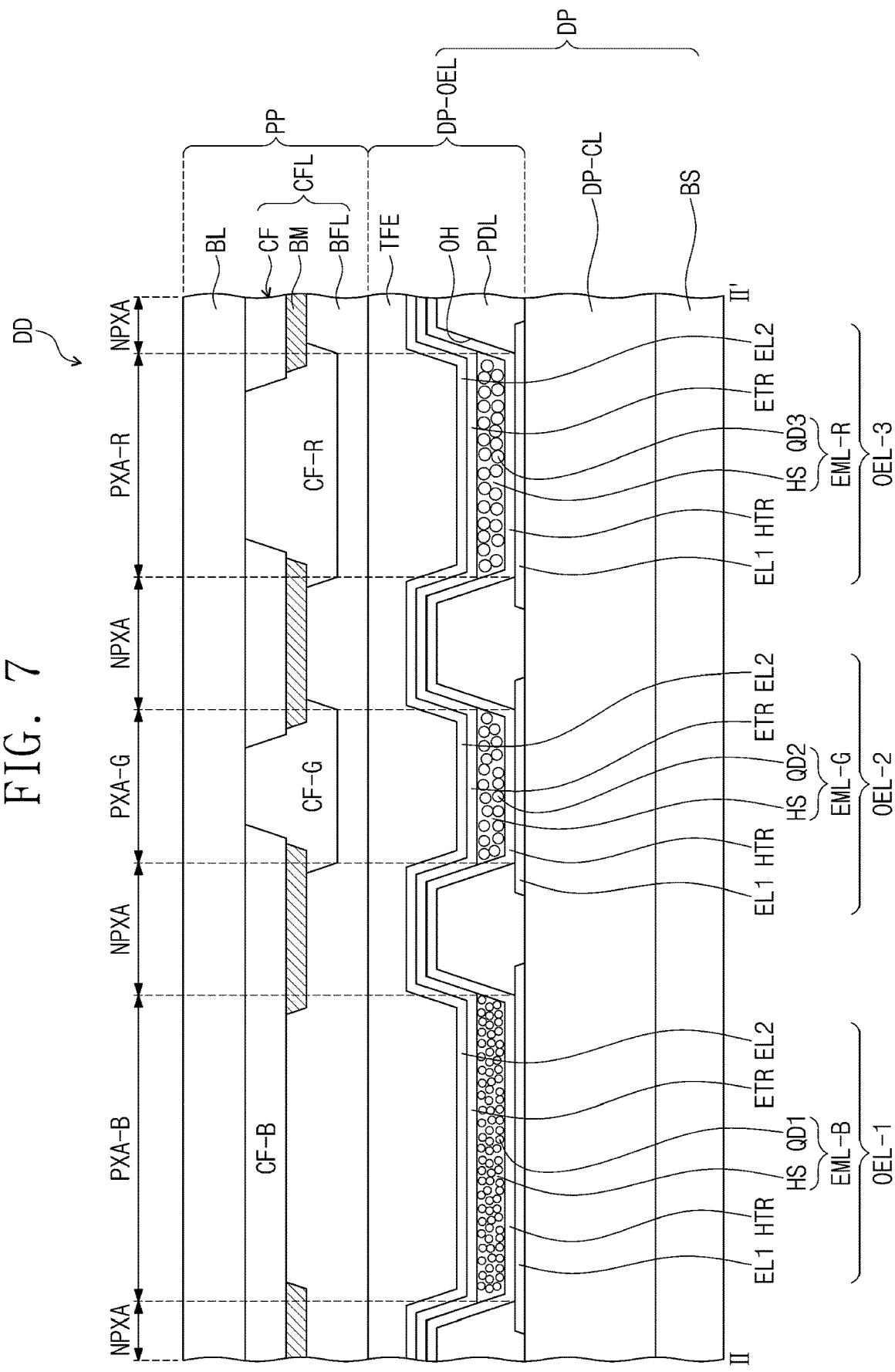
FIG. 7 is a sectional view of a display device, taken along a line II-II' of FIG. 6, according to an embodiment of the inventive concept.

FIG. 6 is a plan view illustrating the display device DD according to an embodiment of the inventive concept. FIG. 7 is a sectional view illustrating the display device DD according to an embodiment of the inventive concept. In detail, FIG. 7 is a sectional view, taken along a line II-II' of FIG. 6.

In one or more embodiments, the display device DD may include a plurality of light emitting devices OEL-1, OEL-2, and OEL-3, and the light emitting devices OEL-1, OEL-2, and OEL-3 may respectively include emission layers EML-B, EML-G, and EML-R respectively containing quantum dots QD1, QD2, and QD3 and the manganese complex compound HS.

Furthermore, the display device DD may include the display panel DP, which includes the plurality of the light emitting devices OEL-1, OEL-2, and OEL-3, and the light control layer PP, which is disposed on the display panel DP. In one or more embodiments, the light control layer PP may be omitted from the display device DD.

The display panel DP may include a base substrate BS, and a circuit layer DP-CL and a display device layer DP-OEL, which are disposed on the base substrate BS. The display device layer DP-OEL may include a pixel defining layer PDL, the light emitting devices OEL-1, OEL-2, and OEL-3, which are disposed between portions of the pixel definition layer PDL, and an encapsulation layer TFE, which is disposed on the light emitting devices OEL-1, OEL-2, and OEL-3.

The base substrate BS may provide a base surface, on which the display device layer DP-OEL is disposed. The base substrate BS may be a glass substrate, a metal substrate, a plastic substrate, and/or the like. However, the inventive concept is not limited to this example, and in one or more embodiments, the base substrate BS may be an inorganic layer, an organic layer, or a composite layer.

In one or more embodiments, the circuit layer DP-CL may be disposed on the base substrate BS and may include a plurality of transistors. Each of the transistors may include a control electrode, an input electrode, and an output electrode. In one or more embodiments, the circuit layer DP-CL may include switching and driving transistors for driving the light emitting devices OEL-1, OEL-2, and OEL-3 of the display device layer DP-OEL.

Each of the light emitting devices OEL-1, OEL-2, and OEL-3 may include the first electrode EL1, the hole transport region HTR, the emission layer EML-B, EML-G, or EML-R, the electron transport region ETR, and the second electrode EL2. The light emitting devices OEL-1, OEL-2, and OEL-3 may be configured to have substantially the same features as those of the light emitting device OEL described above. In other words, the emission layer EML-B, EML-G, or EML-R of the light emitting device OEL-1, OEL-2, or OEL-3 may include the manganese complex compound HS and the quantum dot QD1, QD2, or QD3.

The emission layer EML-B, EML-G, or EML-R may include a manganese complex compound, which is represented by the following Chemical Formula 1, as its host, and may include the quantum dot QD1, QD2, or QD3 as its dopant.

   Chemical Formula 1

In Chemical Formula 1, X may be a univalent or divalent cationic organic compound group and Y may be a halogen atom. In Chemical Formula 1, p may be 1 or 2 and m may be 4 or 6.

The encapsulation layer TFE may cover the light emitting devices OEL-1, OEL-2, and OEL-3. The encapsulation layer TFE may be a single layer or may include a plurality of stacked layers. The encapsulation layer TFE may be a thin encapsulation layer. The encapsulation layer TFE may protect the light emitting devices OEL-1, OEL-2, and OEL-3. The encapsulation layer TFE may cover a top surface of the second electrode EL2 disposed in an opening OH and may fill the opening OH.

In one or more embodiments, a capping layer may be further disposed on the second electrode EL2. In other words, the capping layer may be disposed between the second electrode EL2 and the encapsulation layer TFE. Referring to FIGS. 6 and 7, the display device DD may include a non-light emitting region NPXA and light emitting regions PXA-B, PXA-G, and PXA-R. Each of the light emitting regions PXA-B, PXA-G, and PXA-R may be a region, through which light generated in the light emitting devices OEL-1, OEL-2, and OEL-3 is emitted. The light emitting regions PXA-B, PXA-G, and PXA-R may be spaced apart from each other, when viewed in a plan view (see e.g., FIG. 6).

The light emitting regions PXA-B, PXA-G, and PXA-R may be divided into a plurality of groups, depending on colors of lights generated in the light emitting devices OEL-1, OEL-2, and OEL-3. In the display device DD according to the embodiment shown in FIGS. 6 and 7, three light emitting regions PXA-B, PXA-G, and PXA-R, which emit blue, green, and red lights, respectively, are exemplarily illustrated. For example, the display device DD may include a blue light emitting region PXA-B, a green light emitting region PXA-G, and a red light emitting region PXA-R, which are distinguished (separated/patterned) from each other.

The plurality of the light emitting devices OEL-1, OEL-2, and OEL-3 may emit lights of different wavelengths. For example, in one or more embodiments, the display device DD may include a first light emitting device OEL-1 emitting a blue light, a second light emitting device OEL-2 emitting a green light, and a third light emitting device OEL-3 emitting a red light. However, the inventive concept is not limited to this example, and in one or more embodiments, the first to third light emitting devices OEL-1, OEL-2, and OEL-3 may emit lights of the same wavelength or may emit lights of at least two different wavelengths.

For example, the blue light emitting region PXA-B, the green light emitting region PXA-G, and the red light emitting region PXA-R of the display device DD may correspond to the first light emitting device OEL-1, the second light emitting device OEL-2, and the third light emitting device OEL-3, respectively.

The first emission layer EML-B of the first light emitting device OEL-1 may include a first quantum dot QD1. The first quantum dot QD1 may emit a blue light, which will be referred to as a first color light. The first light emitting device OEL-1 may include a first host.

The second emission layer EML-G of the second light emitting device OEL-2 and the third emission layer EML-R of the third light emitting device OEL-3 may include a second quantum dot QD2 and a third quantum dot QD3, respectively. The second quantum dot QD2 and the third quantum dot QD3 may emit a green light and a red light, respectively, which will be referred to as a second color light and a third color light, respectively. The second light emitting device OEL-2 and the third light emitting device OEL-3 may include a second host and a third host, respectively.

At least one of the first to third hosts may be the manganese complex compound HS, which is represented by the Chemical Formula 1. If at least one of the first to third hosts includes a host material that is not the manganese complex compound HS, it may be formed of or include at least one of suitable host materials. If all of the first to third hosts are the manganese complex compound HS represented by the Chemical Formula 1, at least one or all of the first to third hosts may be different from each other.

In one or more embodiments shown in FIG. 7, the first to third quantum dots QD1, QD2, and QD3 may have different sizes from each other. For example, the first quantum dot QD1, which is used for the first light emitting device OEL-1 emitting light of a relatively short wavelength, may have a mean diameter smaller than those of the second and third quantum dots QD2 and QD3 of the second and third light emitting devices OEL-2 and OEL-3, which emit lights of relatively long wavelengths.

For example, the first to third quantum dots QD1, QD2, and QD3 may be provided to meet the mean diameters condition, which is given by the following Formula 1:

$$\text{Mean diameter of first quantum dot} < \text{Mean diameter of second quantum dot} < \text{Mean diameter of third quantum dot} \quad \text{Formula 1}$$

In the present specification, the mean diameter may correspond to an arithmetic mean of diameters of a plurality of quantum dot particles. Meanwhile, the diameter of the quantum dot particle may be a mean value of a width (or breadth) of a quantum dot particle in a sectional view.

The relationship of the mean diameters of the first to third quantum dots QD1, QD2, and QD3 is not limited to the relationship given by Formula 1. For example, although, in the display device DD according to the embodiment of FIG. 7, the first to third quantum dots QD1, QD2, and QD3 are illustrated to have different sizes, the first to third quantum dots QD1, QD2, and QD3 included in the light emitting devices OEL-1, OEL-2, and OEL-3 may have sizes similar to each other. In one or more embodiments, mean diameters of two quantum dots, which are selected from the first to third quantum dots QD1, QD2, and QD3, may be similar to each other but may be different from that of the other.

In one or more embodiments, the first to third quantum dots QD1, QD2, and QD3 included in the light emitting devices OEL-1, OEL-2, and OEL-3 may be formed of core materials that are different from each other. In one or more embodiments, the first to third quantum dots QD1, QD2, and QD3 may be formed of the same core material. In one or more embodiments, two quantum dots, which are selected from the first to third quantum dots QD1, QD2, and QD3, may be formed of the same core material but may be formed of a core material that is different from that of the other (remaining) quantum dot.

In the display device DD according to the embodiment of FIGS. 6 and 7, the light emitting regions PXA-B, PXA-G, and PXA-R may have areas different from each other. Here, the area may be an area measured on or parallel to a plane defined by the first direction axis DR1 and the second direction axis DR2.

The light emitting regions PXA-B, PXA-G, and PXA-R may have different areas, depending on colors of lights emitted from the emission layers EML-B, EML-G, and EML-R of the light emitting devices OEL-1, OEL-2, and OEL-3. For example, referring to FIGS. 6 and 7, in the display device DD according to an embodiment of the inventive concept, the blue light emitting region PXA-B, which corresponds to the first light emitting device OEL-1 emitting the blue light, may have the largest area, and the green light emitting region PXA-G, which corresponds to the second light emitting device OEL-2 emitting the green light, may have the smallest area. However, the inventive concept is not limited to this example. For example, in one or more embodiments, the light emitting regions PXA-B, PXA-G, and PXA-R may be configured to emit other lights different from the blue, green, and red lights. In certain embodiments, the light emitting regions PXA-B, PXA-G, and PXA-R may have the same area or may have an area ratio different from that shown in FIG. 6.

The light emitting regions PXA-R, PXA-G, and PXA-B may be distinct regions delimited by the pixel defining layer PDL. The non-light emitting regions NPXA may be regions, which are located between adjacent ones of the light emitting regions PXA-B, PXA-G, and PXA-R and correspond to portions of the pixel defining layer PDL. Meanwhile, in the present specification, each of the light emitting regions PXA-B, PXA-G, and PXA-R may correspond to a pixel. The pixel defining layer PDL may be used to delimit or define boundaries of the light emitting devices OEL-1, OEL-2, and OEL-3. The emission layers EML-B, EML-G, and EML-R of the light emitting devices OEL-1, OEL-2, and OEL-3 may be disposed in the openings OH, which are defined by (e.g., which exist in) the pixel definition layer PDL, and thereby may be separated from each other.

The pixel defining layer PDL may be formed of a polymer resin. For example, the pixel defining layer PDL may be formed to include polyacrylate resins and/or polyimide resins. In one or more embodiments, the pixel defining layer PDL may be formed to further include an inorganic material, in addition to the polymer resin. In one or more embodiments, the pixel defining layer PDL may be formed to include at least one of a light absorbing material, a black pigment, or a black dye. In the case where the pixel defining layer PDL includes the black pigment and/or the black dye, the pixel defining layer PDL may realize a black pixel defining layer. Carbon black and/or the like may be used as the black pigment and/or the black dye for the pixel defining layer PDL, but the inventive concept is not limited to this example.

In one or more embodiments, the pixel defining layer PDL may be formed of an inorganic material. For example, the pixel defining layer PDL may be formed to include silicon nitride (SiNx), silicon oxide (SiOx), silicon oxynitride (SiOxNy), and/or the like. The pixel defining layer PDL may define or delimit the light emitting regions PXA-B, PXA-G, and PXA-R. The light emitting regions PXA-B, PXA-G, and PXA-R may be distinguished from the non-light emitting region NPXA by the pixel defining layer PDL.

In FIG. 7 and/or the like, the hole transport region HTR and the electron transport region ETR are illustrated to be a common layer covering the pixel defining layer PDL, but the inventive concept is not limited to this example. In one or more embodiments, the hole transport region HTR and the electron transport region ETR may be disposed in the openings OH defined in the pixel defining layer PDL.

For example, in the case where the hole transport region HTR, the electron transport region ETR, and/or the like are provided by an inkjet printing method, they may be provided to correspond to the openings OH defined between portions of the pixel defining layer PDL. However, the inventive concept is not limited to this example, and in one or more embodiments, the hole transport region HTR and the electron transport region ETR may be provided in the form of an unpatterned common layer covering the pixel defining layer PDL, regardless of a method of forming each of the functional layers shown in FIG. 7.

Referring to FIG. 6, the blue light emitting regions PXA-B and the red light emitting regions PXA-R may be alternately arranged along the first direction axis DR1 to constitute a first group PXG1. The green light emitting regions PXA-G may be arranged along the first direction axis DR1 to constitute a second group PXG2.

The first group PXG1 and the second group PXG2 may be spaced apart from each other along the second direction axis DR2. In one or more embodiments, a plurality of the first groups PXG1 and a plurality of the second groups PXG2 may be provided. The first groups PXG1 and the second groups PXG2 may be alternately arranged along the second direction axis DR2.

One green light emitting region PXA-G may be spaced apart from one blue light emitting region PXA-B or one red light emitting region PXA-R along the fourth direction axis DR4. The direction of a fourth direction axis DR4 may be a direction that is not parallel to both of the first direction axis DR1 and the second direction axis DR2.

The arrangement structure of the light emitting regions PXA-B, PXA-G, and PXA-R shown in FIG. 6 may be referred to as a pentile structure. However, in the display device DD according to embodiments of the inventive concept, the arrangement structure of the light emitting regions PXA-B, PXA-G, and PXA-R is not limited to the structure shown in FIG. 6. For example, in one or more embodiments, the light emitting regions PXA-B, PXA-G, and PXA-R may have a stripe structure, in which the blue light emitting region PXA-B, the green light emitting region PXA-G, and the red light emitting region PXA-R are sequentially and alternately arranged along the first direction axis DR1.

Referring to FIGS. 2 and 7, the display device DD may further include the light control layer PP. The light control layer PP may block or reduce external light, which propagates from the outside of the display device DD toward the display panel DP. The light control layer PP may block or reduce a portion of the external light. The light control layer PP may serve as an anti-reflection layer of minimizing reflection of the external light.

In one or more embodiments shown in FIG. 7, the light control layer PP may include a color filter layer CFL. In the display device DD according to an embodiment of the inventive concept, the light control layer PP may include a base layer BL and the color filter layer CFL.

The base layer BL may be a member providing a base surface, on which the color filter layer CFL and/or the like are disposed. The base layer BL may be a glass substrate, a metal substrate, a plastic substrate, and/or the like. However, the inventive concept is not limited to this example, and in one or more embodiments, the base layer BL may be an inorganic layer, an organic layer, or a composite layer.

The color filter layer CFL may include a light-blocking portion BM and a color filter portion CF. The color filter portion CF may include a plurality of filters CF-B, CF-G, and CF-R. In other words, the color filter layer CFL may include a first filter CF-B to provide (e.g., filter/transmit) a first color light, a second filter CF-G to provide a second color light, and a third filter CF-R to provide a third color light. For example, the first filter CF-B may be a blue filter, the second filter CF-G may be a green filter, and the third filter CF-R may be red filter.

Each of the filters CF-B, CF-G, and CF-R may include a polymer photosensitive resin and a pigment and/or dye. The first filter CF-B may include blue pigment and/or dye, the second filter CF-G may include green pigment and/or dye, and the third filter CF-R may include red pigment and/or dye.

However, the inventive concept is not limited to this example, and in one or more embodiments, the first filter CF-B may not include pigment or dye. For example, the first filter CF-B may include a polymer photosensitive resin but may not include pigment or dye. The first filter CF-B may be transparent. The first filter CF-B may be formed of a transparent photosensitive resin.

The light-blocking portion BM may be a black matrix. The light-blocking portion BM may be formed to include an organic and/or inorganic light blocking material containing black pigment and/or black dye. The light-blocking portion BM may prevent or reduce a light leakage phenomenon and may delimit the filters CF-B, CF-G, and CF-R adjacent to each other.

The color filter layer CFL may further include a buffer layer BFL. For example, the buffer layer BFL may be a protection layer protecting the filters CF-B, CF-G, and CF-R. The buffer layer BFL may be an inorganic layer, which contains at least one inorganic material, such as silicon nitride, silicon oxide, and/or silicon oxynitride. The buffer layer BFL may be composed of a single layer or a plurality of layers.

In one or more embodiments shown in FIG. 7, the first filter CF-B of the color filter layer CFL is illustrated to be overlapped with the second filter CF-G and the third filter CF-R, but the inventive concept is not limited to this example. For example, the first to third filters CF-B, CF-G, and CF-R may be delimited by the light-blocking portion BM and may not be overlapped with each other. In one or more embodiments, the first to third filters CF-B, CF-G, and CF-R may be disposed at regions corresponding to the blue light emitting region PXA-B, the green light emitting region PXA-G, and the red light emitting region PXA-R, respectively.

Figure 8:
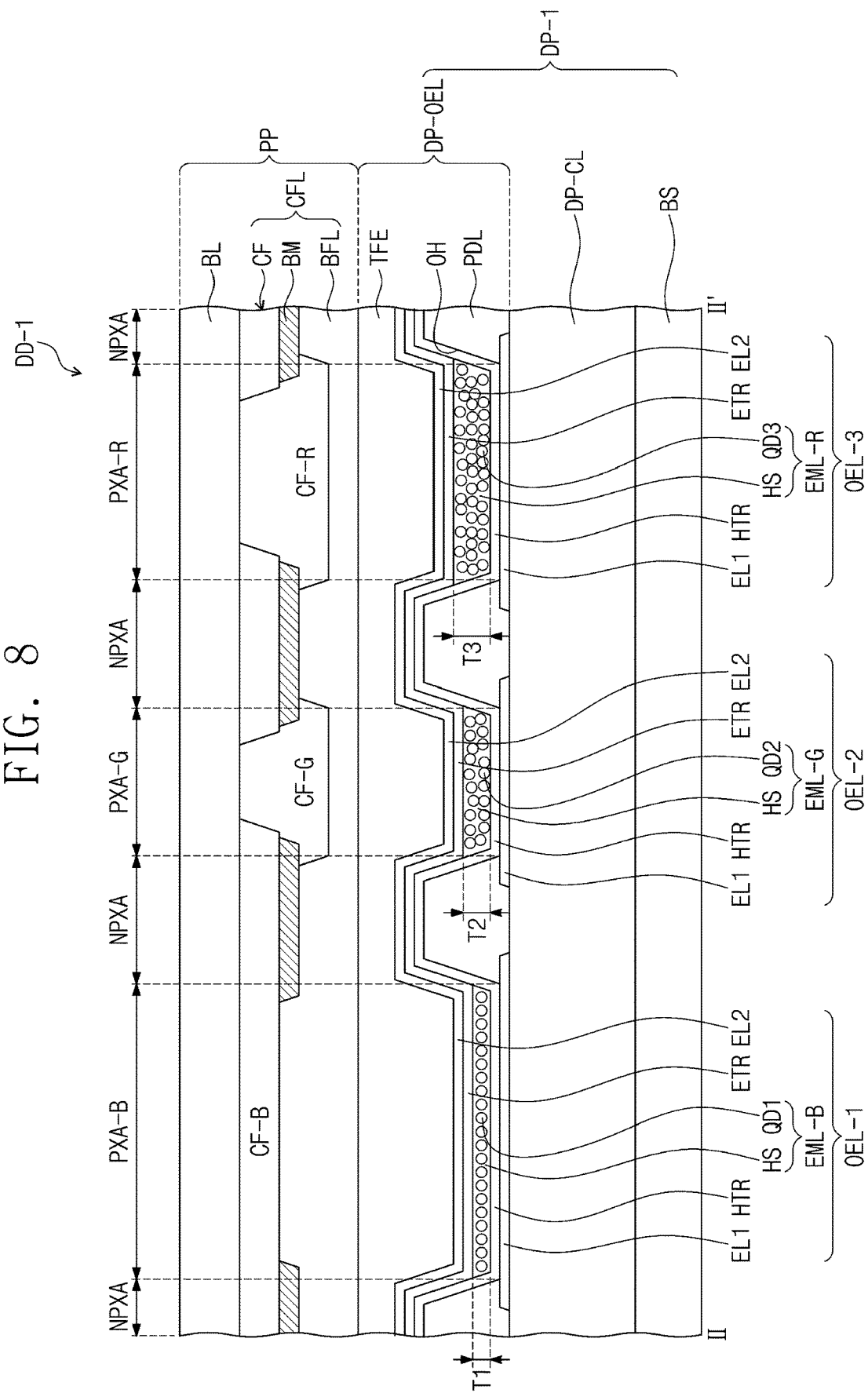
FIG. 8 is a sectional view of a display device according to an embodiment of the inventive concept.
Figure 9:
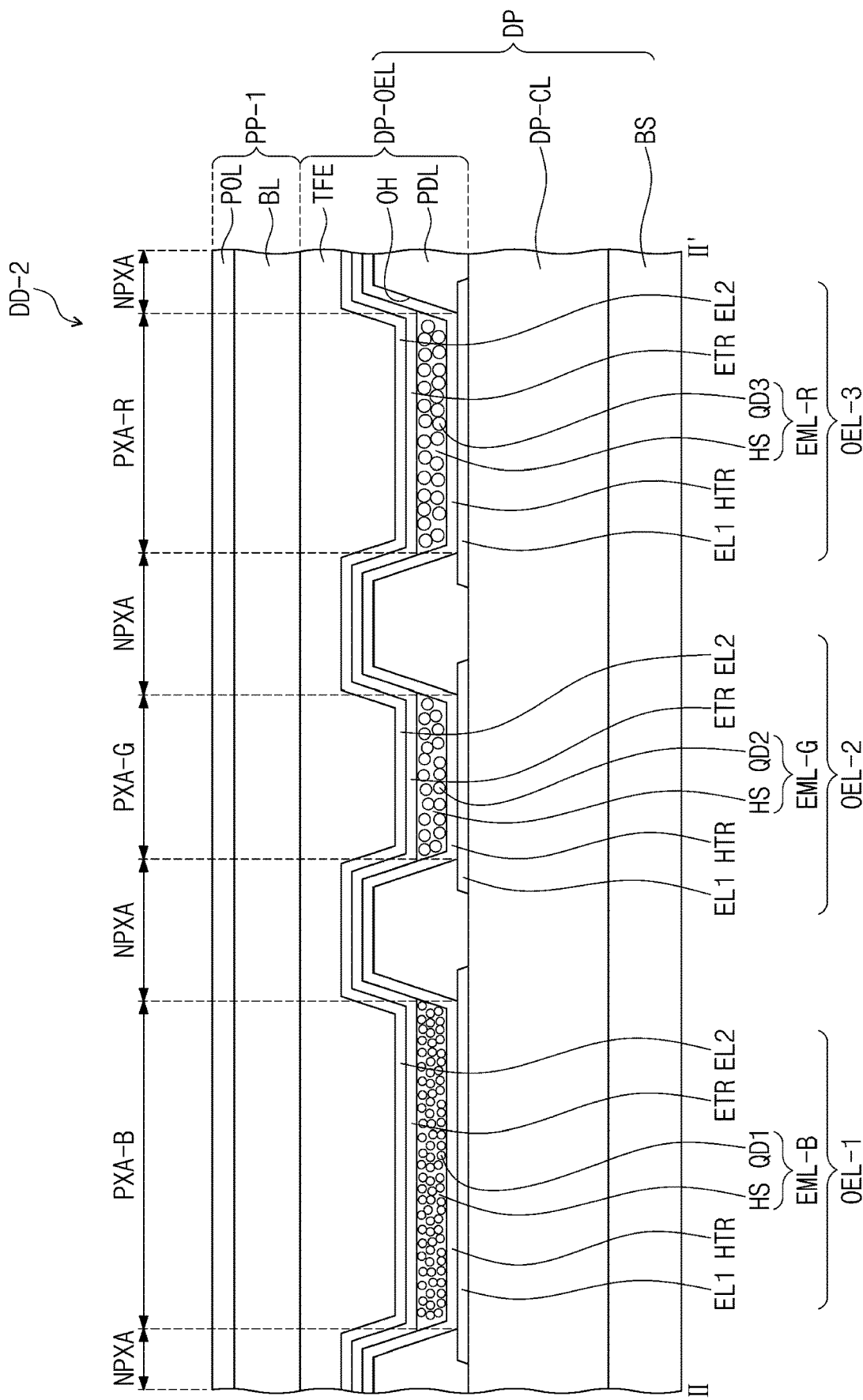
FIG. 9 is a sectional view of a display device according to an embodiment of the inventive concept.

FIGS. 8 and 9 are sectional views illustrating display devices DD-1 and DD-2 according to some embodiments of the inventive concept. In the following description of the display device DD-1 or DD-2 shown in FIGS. 8 and 9, an element previously described with reference to FIGS. 1 to 7 may be identified by the same reference number without repeating an overlapping description thereof, for the sake of brevity.

Referring to FIG. 8, the display device DD-1 according to an embodiment of the inventive concept may include a display panel DP-1 and the light control layer PP. The display panel DP-1 may include a plurality of the light emitting devices OEL-1, OEL-2, and OEL-3.

Each of the light emitting devices OEL-1, OEL-2, and OEL-3 may include the first electrode EL1, the second electrode EL2 facing the first electrode EL1, and the emission layer EML-B, EML-G, or EML-R, which is disposed between the first electrode EL1 and the second electrode EL2 and contains the manganese complex compound HS and the quantum dot QD.

In the display device DD-1 according to the embodiment shown in FIG. 8, the emission layers EML-B, EML-G, and EML-R of the first to third light emitting devices OEL-1, OEL-2, and OEL-3 may have different thicknesses from each other. The first emission layer EML-B of the first light emitting device OEL-1, the second emission layer EML-G of the second light emitting device OEL-2, and the third emission layer EML-R of the third light emitting device OEL-3 may be provided to meet the thickness condition given by the following Formula 2:

$$T1 \le T2 \le T3. \quad \text{Formula 2}$$

In Formula 2, T1 is a thickness of the first emission layer EML-B, T2 is a thickness of the second emission layer EML-G, and T3 is a thickness of the third emission layer EML-R.

Referring to FIG. 8, among the emission layers EML-B, EML-G, and EML-R of the first to third light emitting devices OEL-1, OEL-2, and OEL-3 in the display device DD-1 according to an embodiment of the inventive concept, the first emission layer EML-B of the first light emitting device OEL-1 corresponding to the blue light emitting region PXA-B may have the smallest thickness, and the third emission layer EML-R of the third light emitting device OEL-3 corresponding to the red light emitting region PXA-R may have the largest thickness.

In one or more embodiments, the light control layer PP included in the display device DD-1 may include the color filter layer CFL.

In the embodiment shown in FIG. 9, the display device DD-2 may include the display panel DP, which includes a plurality of the light emitting devices OEL-1, OEL-2, and OEL-3, and a light control layer PP-1. The display panel DP and the light emitting devices OEL-1, OEL-2, and OEL-3, which are included in the display device DD-2 of FIG. 9, may be configured to have substantially the same features as those described with reference to FIG. 7.

The display device DD-2 according to the embodiment shown in FIG. 9 may differ from the display device DD of FIG. 7 in the light control layer. The light control layer PP-1, which is included in the display device DD-2 according to the embodiment shown in FIG. 9, may include a polarization layer POL.

That is, in one or more embodiments, the light control layer PP-1 may include the polarization layer POL and the base layer BL supporting the polarization layer POL.

The base layer BL may be a member providing a base surface, on which the polarization layer POL and/or the like are disposed. The base layer BL may be a glass substrate, a metal substrate, a plastic substrate, and/or the like. However, the inventive concept is not limited to this example, and in one or more embodiments, the base layer BL may be an inorganic layer, an organic layer, or a composite layer.

The polarization layer POL may block or reduce an external light, which is provided to the display panel DP from the outside. The polarization layer POL may block or reduce a portion of the external light.

In addition, the polarization layer POL may reduce a reflection light, which is produced from the display panel DP by the external light. For example, the polarization layer POL may be configured to block or suppress a reflection light, which is incident into the display panel DP from the outside of the display device DD and then is emitted from the display panel DP. The polarization layer POL may be a circular polarizer having an anti-reflection function or the polarization layer POL may include a linear polarizer and a λ/4 phase retarder.

In FIG. 9, the polarization layer POL is illustrated to be an element that is disposed on the base layer BL and is exposed to the outside, but the inventive concept is not limited to this example. For example, the polarization layer POL may be disposed below the base layer BL.

A display device according to one or more embodiments of the inventive concept may include light emitting devices, in which a quantum dot and a manganese complex compound are used as a material for an emission layer, and in this case, it may be possible to improve color reproduction, life span, and light emitting efficiency characteristics of the display device.

According to one or more embodiments of the inventive concept, a light emitting device may include an emission layer containing a quantum dot and a manganese complex compound and thus may exhibit increased life span and improved efficiency.

According to one or more embodiments of the inventive concept, a display device may include a light emitting device, which includes an emission layer containing a quantum dot and a manganese complex compound, and thus may exhibit good color reproduction characteristics, high reliability, and high efficiency.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While example embodiments of the inventive concepts have been particularly shown and described, it will be understood by one of ordinary skill in the art that variations in form and detail may be made therein without departing from the spirit and scope of the present disclosure as defined by the attached claims and equivalents thereof.

What is claimed is:

1. A light emitting device, comprising:
a first electrode;
a second electrode opposite to the first electrode; and
a plurality of functional layers between the first electrode and the second electrode, the plurality of functional layers comprising an emission layer,
wherein the emission layer comprises a manganese complex compound as a host and a quantum dot as a dopant, and
the quantum dot is at least one half in weight of the emission layer.

2. The light emitting device of claim 1, wherein the manganese complex compound is represented by the following Chemical Formula 1:

$$X_pMnY_q,\qquad\text{Chemical Formula 1}$$

wherein in Chemical Formula 1, X is a univalent or divalent cationic organic compound group Y is a halogen atom, p is 1 or 2, and q is 4 or 6.

3. The light emitting device of claim 2, wherein X is BrMTPP((Bromomethyl)triphenylphosphonium), BrPTPP ((3-Bromopropyl)tripheylphosphonium), TPP(tetraphenylphosphonium), TMA(tetramethylammonium), or TEA (tetraethylammonium).

4. The light emitting device of claim 1, wherein a weight ratio between the manganese complex compound and the quantum dot is from 1:1 to 1:2.

5. The light emitting device of claim 1, wherein the emission layer is to emit a green light or a red light.

6. The light emitting device of claim 1, wherein the plurality of functional layers comprises:
a hole transport region between the first electrode and the emission layer; and
an electron transport region between the emission layer and the second electrode.

7. The light emitting device of claim 6, wherein the hole transport region comprises a plurality of sub-functional layers, and
a difference in LUMO energy level between one of the sub-functional layers adjacent to the emission layer and the quantum dot is greater than or equal to 1.5 eV.

8. The light emitting device of claim 1, wherein the emission layer comprises a plurality of the quantum dots, and
the manganese complex compound fills a space between the plurality of the quantum dots.

9. A display device including a plurality of light emitting devices, each of the plurality of light emitting devices comprising:
a first electrode;
a second electrode opposite to the first electrode; and
an emission layer between the first electrode and the second electrode, the emission layer comprising a manganese complex compound as a host and a quantum dot as a dopant,
wherein the quantum dot is at least one half in weight of the emission layer.

10. The display device of claim 9, wherein the manganese complex compound is represented by the following Chemical Formula 1:

$$X_pMnY_q,\qquad\text{Chemical Formula 1}$$

wherein in Chemical Formula 1, X is a univalent or divalent cationic organic compound group, Y is a halogen atom, p is 1 or 2, and q is 4 or 6.

11. The display device of claim 9, wherein the plurality of light emitting devices comprises:
a first light emitting device comprising a first quantum dot to emit a first color light;
a second light emitting device comprising a second quantum dot to emit a second color light, the second color light is longer in wavelength than the first color light; and
a third light emitting device comprising a third quantum dot to emit a third color light, the third color light is longer in wavelength than each of the first color light and the second color light.

12. The display device of claim 11, wherein the first to third quantum dots satisfy the following Formula 1:

mean diameter of first quantum dot<mean diameter of second quantum dot<mean diameter of third quantum dot.  Formula 1

13. The display device of claim 11, wherein a first emission layer of the first light emitting device, a second emission layer of the second light emitting device, and a third emission layer of the third light emitting device satisfy the following Formula 2:

$$T1 \le T2 \le T3,\qquad\text{Formula 2}$$

wherein in Formula 2, T1 is a thickness of the first emission layer, T2 is a thickness of the second emission layer, and T3 is a thickness of the third emission layer.

14. The display device of claim 11, further comprising a light control layer on the plurality of light emitting devices.

15. The display device of claim 14, wherein the light control layer is a polarization layer.

16. The display device of claim 14, wherein the light control layer comprises a color filter layer, and
the color filter layer comprises:
a first filter to provide the first color light;
a second filter to provide the second color light; and
a third filter to provide the third color light.

17. A display device, comprising:
a display panel including a plurality of light emitting devices; and
a light control layer on the display panel,
wherein the light emitting devices comprise:
a first light emitting device comprising a first emission layer, in which a first quantum dot and a first host are included;
a second light emitting device comprising a second emission layer, in which a second quantum dot and a second host are included; and
a third light emitting device comprising a third emission layer, in which a third quantum dot and a third host are included,
wherein at least one of the first to third hosts is a manganese complex compound represented by the following Chemical Formula 1:

$$X_pMnY_q,\qquad\text{Chemical Formula 1}$$

wherein in Chemical Formula 1, X is a univalent or divalent cationic organic compound group, Y is a halogen atom, p is 1 or 2, and q is 4 or 6, and
wherein the first quantum dot is at least one half in weight of the first emission layer, the second quantum dot is at least one half in weight of the second emission layer, and the third quantum dot is at least one half in weight of the third emission layer.

18. The display device of claim 17, wherein X is BrMTPP ((Bromomethyl)triphenylphosphonium), BrPTPP((3-Bromopropyl)tripheylphosphonium), TPP(tetraphenylphosphonium), TMA(tetramethylammonium), or TEA (tetraethylammonium).

19. The display device of claim 17, wherein the first emission layer is to emit a blue light, the second emission layer is to emit a green light, and the third emission layer is to emit a red light.

* * * * *